United States Patent [19]

Holden et al.

[11] Patent Number: 4,914,722
[45] Date of Patent: Apr. 3, 1990

[54] SHOCK ABSORBER FOR CERAMIC FILTERS

[75] Inventors: Harold Holden, Boca Raton; Charles W. Mooney, Lake Worth, both of Fla.

[73] Assignee: Motorola, Inc., Schaumburg, Ill.

[21] Appl. No.: 316,206

[22] Filed: Feb. 27, 1989

[51] Int. Cl.⁴ .............................................. H01L 41/08
[52] U.S. Cl. ..................................... 310/345; 310/327; 310/348; 310/355; 188/268
[58] Field of Search ................................ 310/348–356, 310/326, 327, 345; 174/50, 51, 138 G; 361/403; 220/400–403, DIG. 21; 188/268, 379, 380, 371, 372, 382; 367/136, 153; 333/186–190

[56] References Cited

U.S. PATENT DOCUMENTS

| | | | |
|---|---|---|---|
| 2,380,592 | 7/1945 | Gordon | 310/355 |
| 4,322,652 | 3/1982 | Otsuka | 310/355 X |
| 4,492,892 | 1/1985 | Nakatani | 310/354 X |
| 4,540,908 | 9/1985 | Mooney et al. | 310/355 X |
| 4,577,735 | 3/1986 | Mooney et al. | 310/326 X |
| 4,639,698 | 1/1987 | Nishiki | 310/352 X |
| 4,695,756 | 9/1987 | Tanaka | 310/355 |

FOREIGN PATENT DOCUMENTS 0127812 7/1985 Japan ................................. 310/355

Primary Examiner—Mark O. Budd
Attorney, Agent, or Firm—Vincent B. Ingrassia; Anthony J. Sarli, Jr.

[57] ABSTRACT

A ceramic filter including a plurality of ceramic plates contacted by metal plates and enclosed within a housing includes a Teflon membrane having a plurality of bubbles or dimples therein. A curved spring plate is positioned between a wall of the housing and one of the metal plates. The shock absorbing membrane is positioned between the spring plate and the wall of the housing, and the bubbles thereof extend through openings in the spring plate. When the filter is subjected to a force substantially perpendicular to the ceramic plates, the bubbles in the shock absorber cause the edges of the metal plate to deflect upwards and thus support the adjacent ceramic plate so as to avoid shattering or cracking.

8 Claims, 4 Drawing Sheets

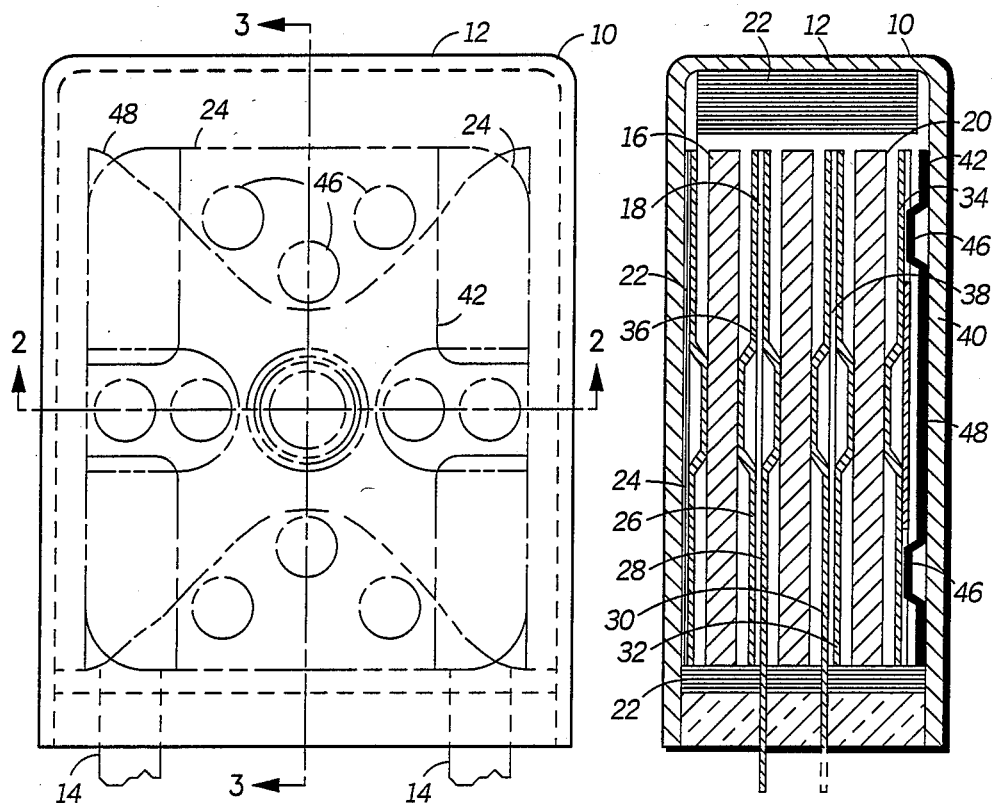
FIG.1
FIG.3
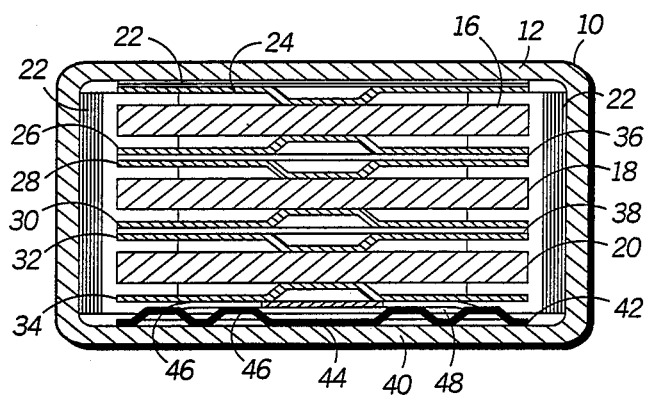
FIG.2

SHOCK ABSORBER FOR CERAMIC FILTERS

BACKGROUND OF THE INVENTION

This invention relates generally to shock absorbers for electronic components, and more particularly, to a shock absorbing member for protecting the ceramic plates in an electronic ceramic filter.

Ceramic filters are frequently used in electronic radio equipment such as two-way radios, pagers, and the like. Unfortunately, such filters include fragile ceramic plates, and since two-way radios and pagers are often dropped, it is not uncommon for the above referred to ceramic plates to become damaged resulting in a malfunction.

A number of solutions to this problem have been proposed and have met with varying degrees of success. For example, it is known to coat the inner surface of a component enclosure with plastic to absorb shock. It is also known to employ rubber spacers and metallic spring plates. None of these solutions, however, provide the degree of shock and vibration protection necessary.

To overcome the disadvantages associated with known solutions to the problem, U.S. Pat. No. 4,540,908 entitled "Shock Absorber for Quartz Crystals" issued September 10, 1985 describes a shock absorbing insert for protecting a fragile quartz crystal. A Teflon carrier with sloping walls carries a number of dimple o rib shaped springs. These springs have varying spring rates increasing as they get farther from the base. The carrier is supported by a cushion spring system having a lower spring rate than that of the dimple or rib springs. This structure allows the force of mechanical shock to be distributed across the entire surface of the crystal rather than being concentrated at isolated areas of high stress.

SUMMARY OF THE INVENTION

It is an object of the present invention to provide an improved shock absorbing apparatus for ceramic filter components.

It is a further object of the present invention to provide an improved shock absorber for ceramic filter components which is compatible with existing ceramic filter structures.

According to a broad aspect of the invention, there is provided a shock absorbing apparatus for protecting at least one ceramic plate in a ceramic electronic filter. The ceramic plate has a first major surface which is contacted by a metal plate. Both the metal plate and the ceramic plate are positioned within a metallic enclosure. A first spring means having at least one opening therethrough is positioned between a wall of the housing and the metallic plate for urging the metallic plate into contact with the ceramic plate while maintaining electrical contact with the housing. An elastomeric base material is positioned between the first spring means and the wall of the enclosure. Second spring means is coupled to the base material and supports the ceramic plate through the opening in the first spring means when the ceramic plate is subjected to a force which is generally perpendicular to the ceramic plate. The second spring means may comprise one or more elastomeric dimples or bubbles formed integrally with the base material. The elastomeric material may be, for example, Teflon.

The above and other objects, features, and advantages of the present invention will be more clearly understood from the following detailed description taken in conjunction with the accompanying drawings in which:

BRIEF DESCRIPTION OF THE DRAWINGS

FIG. 1 is a plan view of a ceramic filter which includes the inventive shock absorber;

FIGS. 2 and 3 are top and side cross-sectional views of the ceramic filter shown in FIG. 1 taken along lines 2—2 and 3—3 respectively;

DESCRIPTION OF THE PREFERRED EMBODIMENT

Figure 4:
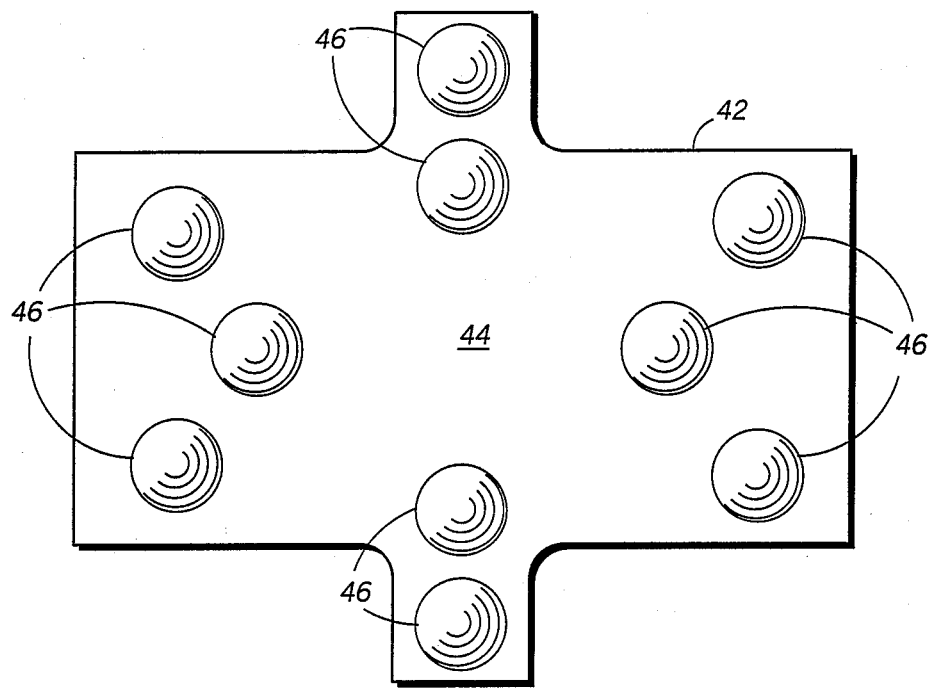
FIGS. 4 and 5 are plan and cross-sectional side views of the shock absorber utilized in the ceramic filter shown in FIGS. 1, 2, and 3.

FIG. 1 is a plan view of a ceramic filter component embodying the inventive shock absorber. FIGS. 2 and 3 are cross-sectional views of the ceramic filter shown in FIG. 1 taken along lines 2—2 and 3—3 respectively. Referring to FIGS. 1, 2, and 3, a ceramic filter component 10 comprises a metallic enclosure 12 having terminals 14 extending therefrom. A plurality of ceramic plates 16, 18, and 20, are housed within enclosure 12, and the interior of enclosure 12 is coated on four surfaces with silicone rubber or the like as is shown at 22. A pad 49 separates plate 24 from wall 50.

Each of the ceramic plates has one of its major surfaces contacted by a metal plate having a contact area. For example, ceramic plate 16 is contacted by metal plates 4 and 26, each having a central circular region which contacts opposite major surfaces of ceramic plate 16. Similarly, ceramic plate 18 is contacted by metal plates 28 and 30, and ceramic plate 20 is contacted by metal plates 32 and 34. Metal plates 26 and 28 are separated by an insulating layer 36 (e.g. silicone rubber). Similarly, metal plates 30 and 32 are separated by insulating layer 38.

Figure 5:
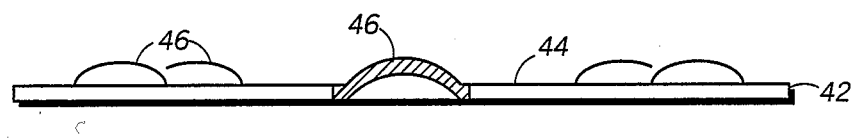

Located adjacent to inner surface of wall 40 is an elastomeric (e.g. Teflon) shock absorber 42 comprised of a base 44 and a plurality of integrally formed bubbles or ribs 46 as is shown in more detail in FIGS. 4 and 5. As can be seen from FIGS. 4 and 5, shock absorber 42 is cross shaped with each member of the cross having a plurality of bubbles or dimples 46 positioned proximate the ends thereof.

Figure 6:
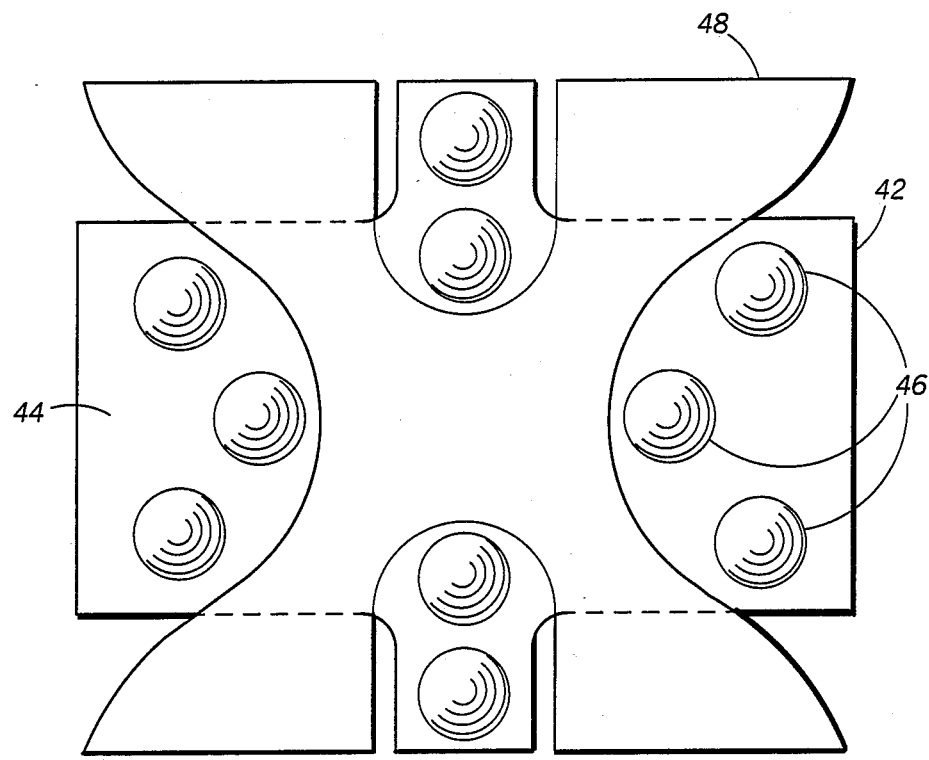
FIG. 6 is a plan view illustrating the cooperative relationship between the shock absorber and spring plate utilized in the ceramic filter shown in FIGS. 1, 2, and 3.
Figure 7:
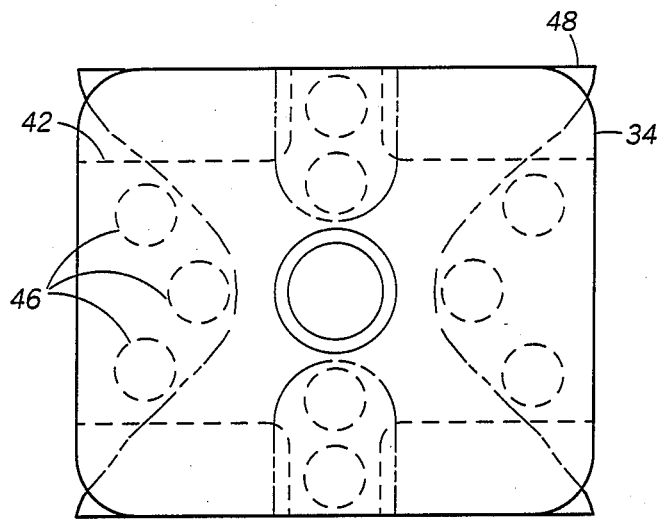
FIG. 7 is a plan view illustrating the cooperative relationship between the shock absorber, spring plate, and metal contact plate utilized in the ceramic filter shown in FIGS. 1, 2, and 3.

Positioned between shock absorber 42 and metal plate 34 is a curved spring plate 48 shown in more detail in FIG. 6. As can be seen, spring plate 48 has a general shape of an hourglass with notches at the upper and lower ends thereof. In this manner, bubbles or dimples 46 may contact metal plate 34 through openings on the upper, lower, and both sides of the spring plate as is shown in FIG. 2. FIG. 7 is a plan view illustrating metal plate 34 positioned above spring plate 48 which is in turn positioned above shock absorber 42.

Figure 8:
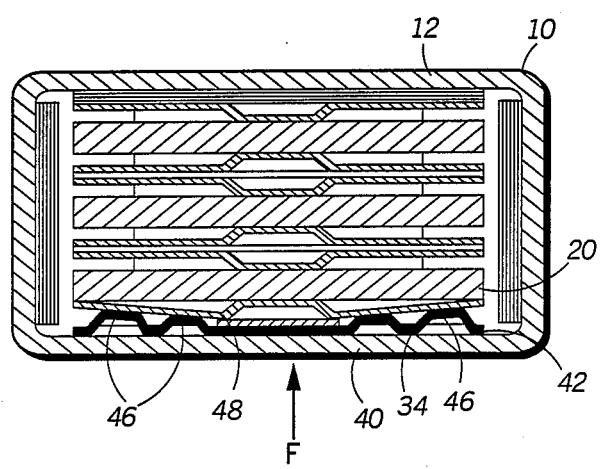
FIG. 8 is a cross-sectional view of the ceramic filter in a mechanically stressed condition.

When the ceramic filter assembly is subjected to a sudden force as is shown by the arrow F in FIG. 8, the entire assembly of ceramic plates and metal plates will deflect downwards towards wall 40 causing spring plate 48 to flatten. However, as can be seen, bubbles 46 contact the metal plate proximate its outer edge so as to support the metal plate which in turn supports ceramic plate 20, thus preventing it from being cracked or shattered. For example, should the unit be dropped on wall 40, spring plate 48 would deflect and a secondary impact produced. This secondary impact produces a shock when the ceramic plate 20 hits metal plate 34 below it. Shock absorber 42 will cause metal plate 34 to deflect and support it during its movement towards wall 40, thus greatly reducing the secondary shock. In addition, the center contact portion of metal plate 34 likewise supports ceramic plate 20. The shape of shock absorber 42 and the location of bubbles 46 render the shock absorber self-locating and self-fixturing.

The above description is given by way of example only. Changes in form and details may be made by one skilled in the art without departing from the scope of the invention as defined by the appended claims.

What is claimed is:

1. In a ceramic electronic filter of the type wherein at least one ceramic plate having a first major surface contacted by a first metal plate is housed within a metallic enclosure, and wherein first spring means having at least one opening therethrough is positioned between a wall of said housing and said first metallic plate for urging said first metallic plate into contact with said at least one ceramic plate, a shock absorbing apparatus for protecting said at least one ceramic plate, comprising:
   an elastomeric base material positioned between said first spring means and said wall; and
   second spring means coupled to said base material for supporting said at least one ceramic plate through said at least one opening when said at least one ceramic plate is subjected to a force which is generally perpendicular to said at least on ceramic plate.

2. An apparatus according to claim 1 wherein said second spring means extends through said at least one opening.

3. An apparatus according to claim 2 wherein said second spring means supports said first metallic plate when said metallic plate is subjected to said force.

4. An apparatus according to claim 3 wherein said second spring means comprises at least one elastomeric dimple protruding from said base material.

5. An apparatus according to claim 4 wherein said second spring means comprises a plurality of elastomeric dimples protruding from said base material.

6. An apparatus according to claim 5 wherein said plurality of elastomeric dimples are integral with said base material.

7. An apparatus according to claim 6 wherein said first metallic plate has an outer edge and wherein said plurality of dimples are positioned so as to support said first metallic plate proximate said outer edge.

8. An apparatus according to claim 7 wherein said elastomeric material is Teflon.

* * * * *